United States Patent
Allard et al.

(10) Patent No.: US 8,841,209 B2
(45) Date of Patent: Sep. 23, 2014

(54) METHOD FOR FORMING CORELESS FLIP CHIP BALL GRID ARRAY (FCBGA) SUBSTRATES AND SUCH SUBSTRATES FORMED BY THE METHOD

(75) Inventors: Sylvie Allard, Granby (CA); Jean Audet, Granby (CA); Kevin Arthur Dore, Wappinger Falls, NY (US); Sylvain Pharand, St-Bruno (CA); David John Russell, Owego, NY (US)

(73) Assignee: International Business Machines Corporation, Armonk, NY (US)

( * ) Notice: Subject to any disclaimer, the term of this patent is extended or adjusted under 35 U.S.C. 154(b) by 76 days.

(21) Appl. No.: 13/212,489

(22) Filed: Aug. 18, 2011

(65) Prior Publication Data

US 2013/0043060 A1 Feb. 21, 2013

(51) Int. Cl.
*H01L 21/4763* (2006.01)
*H01L 21/44* (2006.01)

(52) U.S. Cl.
USPC ............ 438/618; 438/622; 438/652; 257/758

(58) Field of Classification Search
USPC ........................... 438/618, 622, 652; 257/758
See application file for complete search history.

(56) References Cited

U.S. PATENT DOCUMENTS

| | | | |
|---|---|---|---|
| 7,353,591 B2 | 4/2008 | Yeh | |
| 7,459,782 B1 | 12/2008 | Li | |
| 7,682,972 B2 | 3/2010 | Hurwitz et al. | |
| 2007/0193679 A1* | 8/2007 | Iwata | 156/247 |
| 2007/0263370 A1* | 11/2007 | Niki | 361/783 |
| 2008/0197501 A1* | 8/2008 | Imanaka | 257/758 |
| 2008/0264684 A1* | 10/2008 | Kang et al. | 174/262 |
| 2009/0145635 A1* | 6/2009 | Shimizu | 174/255 |
| 2010/0073894 A1* | 3/2010 | Mortensen et al. | 361/782 |

* cited by examiner

*Primary Examiner* — Thanh V Pham
(74) *Attorney, Agent, or Firm* — J. B. Kraft; Parashos T. Kalaitzis

(57) ABSTRACT

A method for forming coreless flip chip ball grid array (FCBGA) substrates comprising the steps of sequentially depositing a pair of laminates, each having a plurality of insulated metallization layers simultaneously respectively on each side of a temporary carrier substrate, and then removing the temporary carrier to separate the pair of laminates, so that each laminate has an outer ball grid metal pad array, and during the depositing of the pair of laminates on the carrier substrate, further depositing a supporting layer of dielectric material enclosing the metal pad array, wherein said supporting layers of dielectric material provides structural support for each of the laminates after the separation.

14 Claims, 4 Drawing Sheets

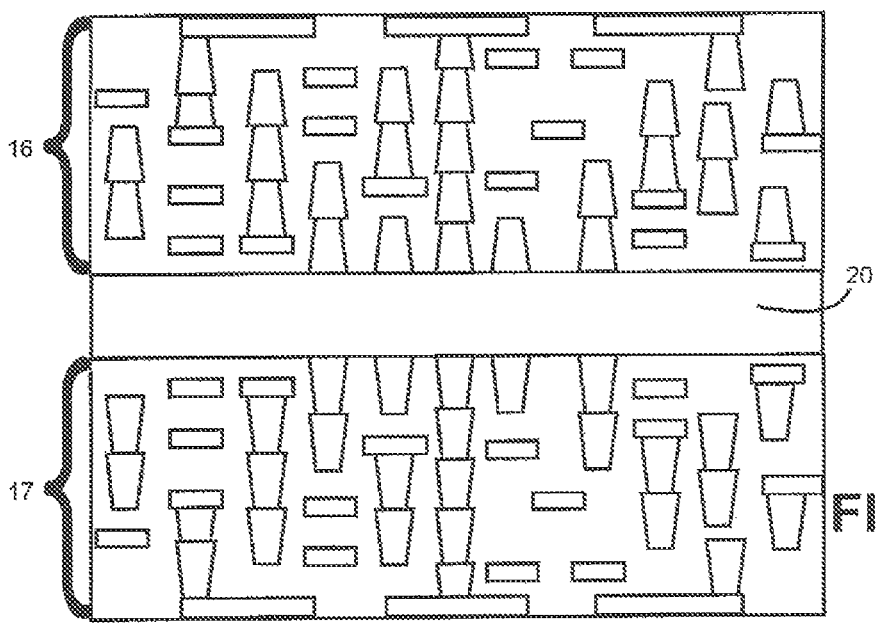
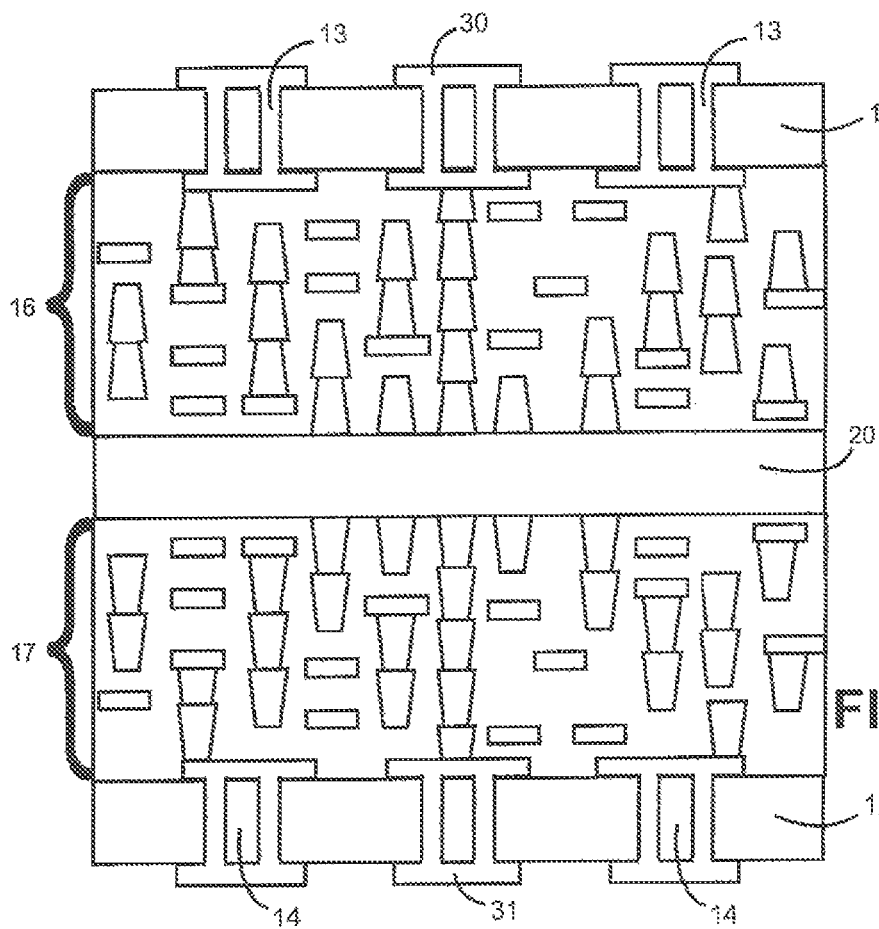

METHOD FOR FORMING CORELESS FLIP CHIP BALL GRID ARRAY (FCBGA) SUBSTRATES AND SUCH SUBSTRATES FORMED BY THE METHOD

TECHNICAL FIELD

The present invention relates to flip chip ball grid array (FCBGA) substrates, and more particularly to coreless FCBGA substrates.

BACKGROUND OF RELATED ART

Conventional semiconductor integrated circuit packaging utilize flip chip ball grid array substrates form a grid array of pads on which solder balls are placed to provide the connections to the substrate. In the past, a substrate core was initially provided, followed by drilling, and conductive plating in layers to a conductive multilayer laminate. Typical FCBGA laminated substrates using this build up technology use a dielectric material such as glass clothe reinforced resin about 200-800 um in thickness for this middle core. Layers are built up on both sides of the middle core through a double sided process wherein corresponding layers are simultaneously formed on each side of the core to provide a laminate of layers. The middle core must include drilled holes plated with a metal, such as copper to provide paths for the electrical connection between the laminate layers on either side of the core. The core contributes desirable mechanical properties, such as high modulus and low CTE (coefficient of thermal expansion) that imparts handling strength and reduced warpage to the laminate. However, the drilled holes through the core, which must be relatively large, requires large areas in these micro-miniature structures. The core also imposes a significant thickness to the miniature structure. These aspects are less than desirable.

Accordingly, the FCBGA industries have been exploring and developing coreless FCBGA laminates. The advantage of such coreless laminates is that they do not have the limitations required for conducting wiring through the thick core, and thus, take advantage of the resulting higher wiring densities enabled at all levels of the coreless laminates. Consequently, cordless laminates having equivalent electrical function with fewer layers may be produced.

However, a trade-off or disadvantage of coreless laminates is the mechanical integrity or strength of a core structure. The coreless laminates are, at times, prone to high warpage and present handling challenges during both laminate fabrication and subsequent module assembly levels.

For example, a typical current process for fabricating coreless laminate structures begins with a stiff carrier, such as one made of conventional core material or heavy copper. A laminate is built up on each side of the carrier. Each laminate is intended to provide a separated coreless laminate chip support structure when the intermediate core is removed. However, such finished coreless laminate structures are difficult to handle as described above and are subject to warpage.

SUMMARY OF THE PRESENT INVENTION

The present invention is directed to providing a coreless structure which is strong and stiff enough to minimize warpage and the above mentioned handling problems.

Accordingly, the present invention provides a method for forming coreless flip chip ball grid array (FCBGA) substrates comprising the steps of sequentially depositing a pair of laminates, each having a plurality of insulated metallization layers simultaneously deposited respectively on each side of a temporary carrier substrate, and then removing the temporary carrier to separate the pair of laminates, so that each laminate has an outer ball grid metal pad array, and during the depositing of the pair of laminates on the carrier substrate, depositing a supporting layer of stiff dielectric material as the dielectric layer enclosing the metal pad array, wherein said supporting layers of stiff dielectric material provides structural support for each of the laminates after the separation.

In accordance with one aspect of this invention, in the step of sequentially depositing the two laminates on both sides of the temporary carrier substrate, the ball grid array pad layer is the first deposited layer, and the layer of stiff dielectric material is deposited on the carrier prior to this first layer. On the other hand, in depositing of the two laminates on both sides of the temporary carrier substrate, the ball grid array pad layer may be the last deposited layer. In such a case, the layer of stiff dielectric material is deposited last as the dielectric of the last layer.

The ball grid array pad layer preferably has the lowest connector density of all of the layers in the laminates.

BRIEF DESCRIPTION OF THE DRAWINGS

The present invention will be better understood and its numerous objects and advantages will become more apparent to those skilled in the art by reference to the following drawings, in conjunction with the accompanying specification, in which:

FIG. 3 is a diagrammatic view of an embodiment of a late step in the fabrication of a FCBGA laminate showing an embodiment of fabricating a pair of laminates on both sides of temporary carrier, wherein the ball grid pad layer is the layer in the laminate deposited last;

FIG. 4 is a diagrammatic view of a final stage in the assembly of the embodiment of FIG. 3;

DETAILED DESCRIPTION OF THE PREFERRED EMBODIMENT

Figure 1:
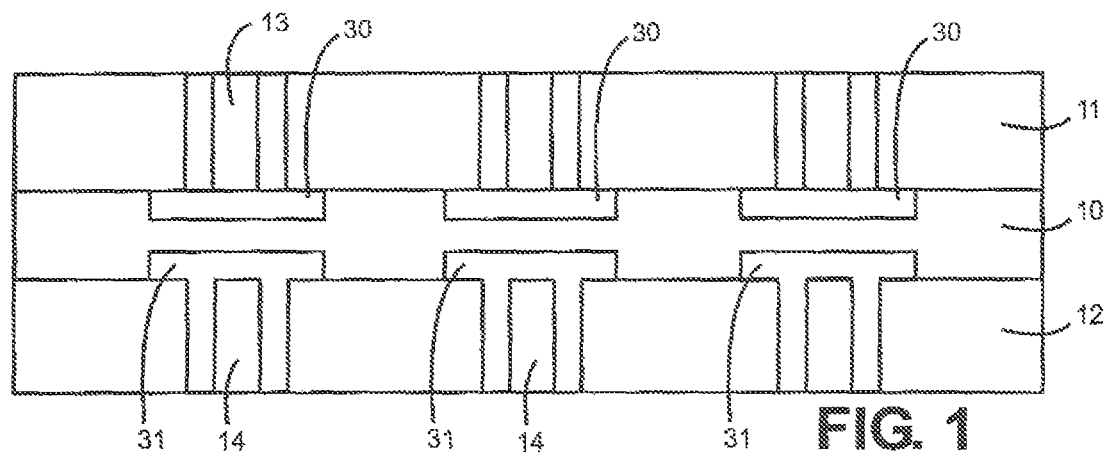
FIG. 1 is a diagrammatic view of an illustrative early step of the assembly of a FCBGA laminate showing an embodiment of assembling a pair of laminates on both sides of temporary carrier, wherein the ball grid pad layer is the layer in the laminate deposited first.

Now with reference to FIG. 1, on a temporary sacrificial middle copper plate carrier 10, standard ball grid metal pad array layers 30 and 31 are respectively formed on either side. Then, on each side of the carrier 10, supporting permanent layers 11 and 12 of stiff dielectric material are respectively formed enclosing circuit layers 13 and 14 and their pad arrays 30 and 31. It should be noted that the ball grid metal pad array layer has been selected for supporting layers 11 and 12 because layers 13 and 14 have the lowest metallic connector density of all of the layers in the FCBGA laminate being built. The stiff dielectric material used for layers 11 an 12 should have a low coefficient of thermal expansion. It may be any of the following among others: glass reinforced epoxy resins, polyimides, and other polymeric materials. It may be a ceramic material including polymeric ceramic materials.

Figure 2:
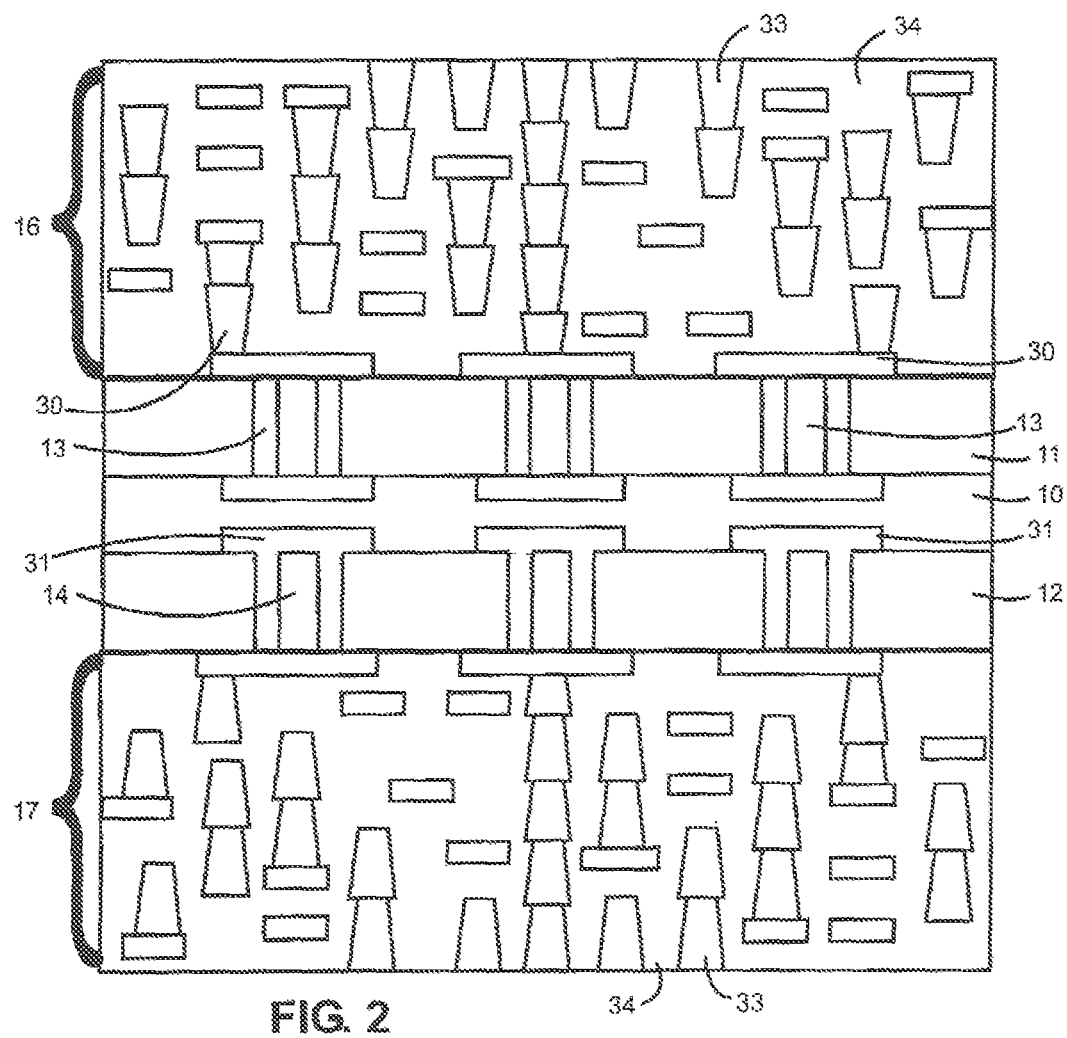
FIG. 2 is a diagrammatic view of a final stage in the assembly of the embodiment of FIG. 1.

After the structure of FIG. 1 is formed, the rest of the laminate structures 16 and 17 are deposited to form a corresponding layered laminate FCBGA substrate structure on each side of sacrificial carrier 10, as illustrated in FIG. 2. Laminate structures 16 and 17 are comprised of layers of electrically insulating material 34 enclosing metallization 33. Consisting of circuit features and plated via interconnects.

Figure 5:
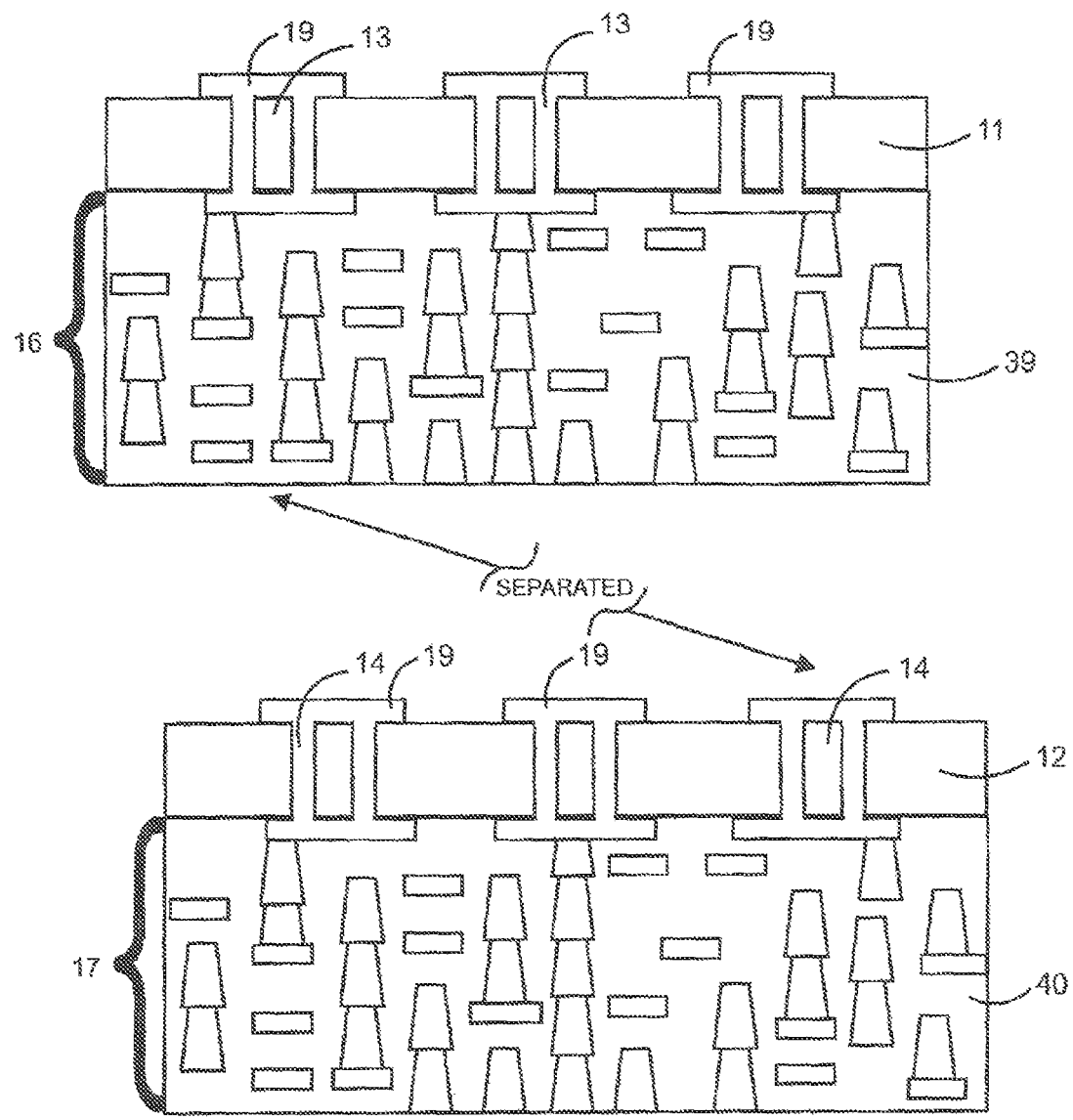
FIG. 5 is a diagrammatic view of the pair of laminate substrates of the present invention complete and separated from the temporary carrier which laminate substrates may have been made by either the assembly process of FIGS. 1 and 2, or the assembly process of FIGS. 3 and 4.

Then, as shown in FIG. 5, carrier 10 is removed. This removal may conventionally be done by having a release layer of organic material coated on both sides of a copper carrier plate 10, and selectively etching the release layer in an acidic bath to result in the separated completed substrates 39 and 40, each with a respective pad array 19 for connection cards using conventional BGA solder balls following attachment of the die to the opposite side.

Now, with reference to FIG. 3, an alternative process for producing the separated completed substrates 39 and 40 of FIG. 5 will be described. Laminates 16 and 17, described hereinabove are first deposited on a copper plate temporary carrier 20. Then, FIG. 4, standard ball grid metal pad array layers 13 and 14 are respectively formed on laminates 16 and 17. Supporting permanent layers 11 and 12 of stiff dielectric material are respectively formed enclosing circuit layers 13 and 14 and their pad arrays 30 and 31. Then, as shown in FIG. 5, carrier 10 is removed, as described hereinabove, to result in the separated completed substrates 39 and 40, each with a respective pad array 19 for connection to cards using conventional BGA solder balls following attachment of the die to the opposite side.

Figure 6:
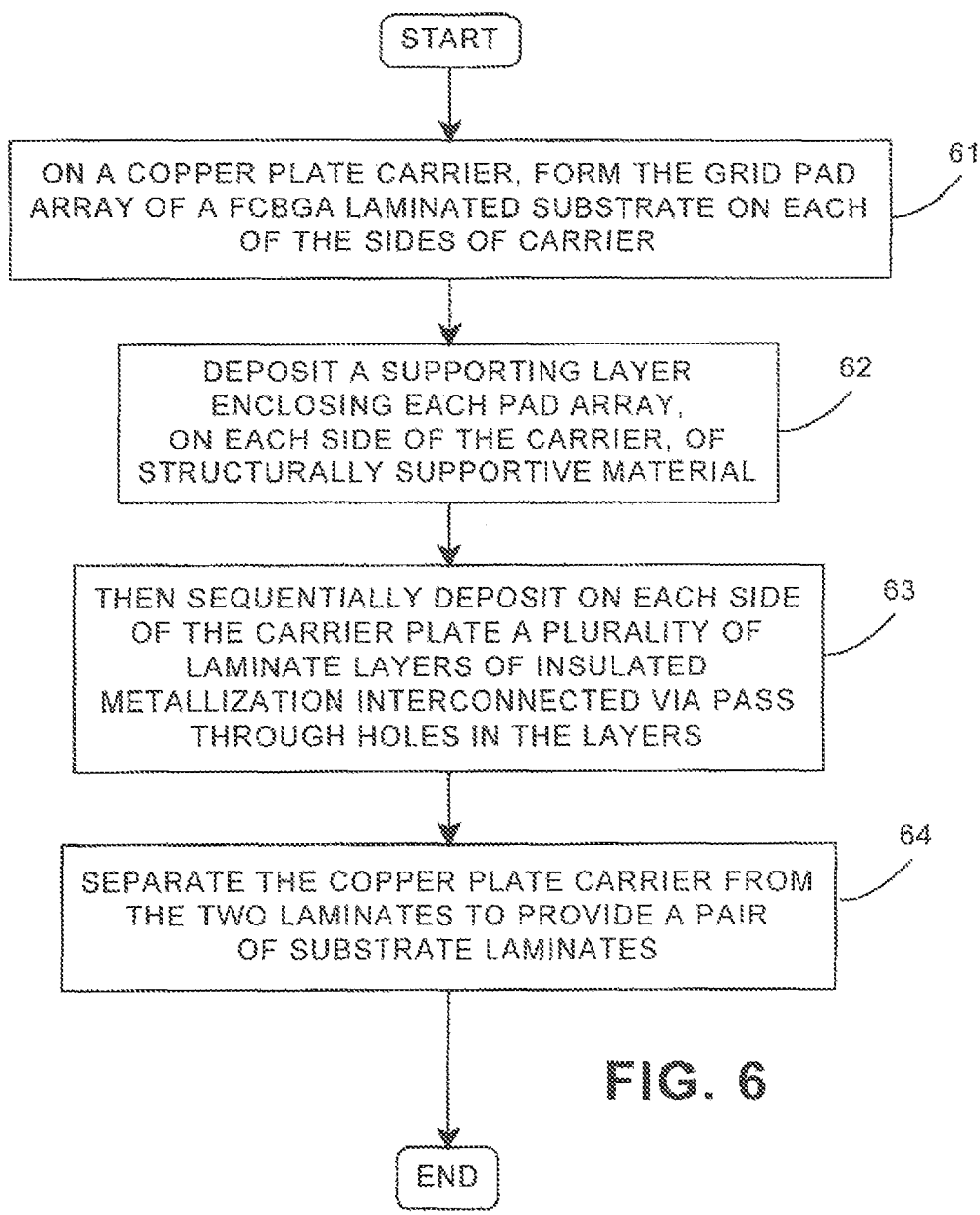
FIG. 6 is a generalized flowchart of steps in the process of assembling of a FCBGA laminate substrate in accordance with the present invention.

Now, with respect to FIG. 6, there will be described step in an example process according to the present invention. On a copper plate carrier, there is formed a grid pad array of a FCBGA laminated substrate on each side of the carrier, step 61. Then there is deposited a supporting layer of stiff dielectric structurally supportive material, step 62. Then, there is sequentially deposited on each side of the carrier plate covered with the supportive layer, a plurality of laminate layers of insulated metallization interconnected via pass through holes in the layers, step 63. The copper plate carrier is separated to provide a pair of the substrates laminates, step 64.

Although certain preferred embodiments have been shown and described, it will be understood that many changes and modifications may be made therein without departing from the scope and intent of the appended claims.

What is claimed is:

1. A method for forming coreless flip chip ball grid array (FCBGA) substrates comprising:
   coating two sides of a temporary copper plate carrier substrate with a dielectric release layer;
   depositing on each respective side of said temporary copper carrier substrate, one of a pair of laminates, each laminate having a plurality of metallization layers wherein each laminate has, in contact with said copper substrate, a laminate supporting layer of dielectric material enclosing an array of metallic interconnectors;
   forming an outer layer comprising said grid ball array on each o said pair of laminates; and
   removing the temporary copper carrier substrate by etching said dielectric release layers to separate said pair of laminates from the remaining copper plate, wherein each laminate as an outer ball grid metal pad array.

2. The method of claim 1, wherein said ball grid array pad layer has the lowest metallic connector density of all of the layers in each laminate.

3. The method of claim 1, wherein said dielectric material in said dielectric layer is a glass fiber reinforced epoxy resin, material.

4. The method, of claim 1, wherein said dielectric material in said dielectric layer is a low coefficient of thermal expansion organic material.

5. The method of claim 4, wherein said organic material in said dielectric layer is a polyimide.

6. The method of claim 1, wherein said dielectric material in said dielectric layer is a ceramic material.

7. The method of claim 1, wherein said dielectric material in said dielectric layer is a polymeric ceramic material.

8. A coreless flip chip ball grid array (FCBGA) substrate formed by the method comprising:
   coating two sides of a temporary copper plate carrier substrate with a dielectric release layer;
   depositing on each respective side of said temporary copper carrier substrate, one of a pair of laminates, each laminate having a plurality of metallization layers wherein each laminate has, in contact with said copper substrate, a laminate supporting layer of dielectric material enclosing an array of metallic interconnectors;
   forming an outer layer comprising said grid ball array on each of said pair of laminates; and
   removing the temporary copper carrier substrate by etching said dielectric release layers to separate said pair of laminates from the remaining copper plate, wherein each laminate as an outer ball grid metal pad array.

9. The coreless flip chip ball grid array of claim 8, wherein said ball grid array pad layer has the lowest metallic connector density of all of the layers in each laminate.

10. The coreless flip chip ball grid array of claim 8, wherein said dielectric material in said dielectric layer is a glass fiber reinforced epoxy resin material.

11. The coreless flip chip ball grid array of claim 8, wherein said dielectric material in said dielectric layer is a low coefficient of thermal expansion organic material.

12. The coreless flip chip ball grid array of claim 11, wherein said organic material in said dielectric layer is a polyimide.

13. The coreless flip chip ball grid array of claim 8, wherein said dielectric material in said dielectric layer is a ceramic material.

14. The coreless flip chip ball grid array of claim 8, wherein said dielectric material in said dielectric layer is a polymeric ceramic material.

* * * * *